United States Patent
Ito et al.

(10) Patent No.: US 11,322,350 B2
(45) Date of Patent: May 3, 2022

(54) NON-PLASMA ETCH OF TITANIUM-CONTAINING MATERIAL LAYERS WITH TUNABLE SELECTIVITY TO ALTERNATE METALS AND DIELECTRICS

(71) Applicant: Tokyo Electron Limited, Tokyo (JP)

(72) Inventors: Daisuke Ito, Hillsboro, OR (US); Subhadeep Kal, Albany, NY (US); Shinji Irie, Nirasaki (JP); Aelan Mosden, Hopewell Junction, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/868,277

(22) Filed: May 6, 2020

(65) Prior Publication Data

US 2021/0057213 A1   Feb. 25, 2021

Related U.S. Application Data

(60) Provisional application No. 62/891,115, filed on Aug. 23, 2019.

(51) Int. Cl.
| | |
|---|---|
| *H01L 21/3065* | (2006.01) |
| *H01L 21/027* | (2006.01) |
| *H01J 37/32* | (2006.01) |
| *H01L 21/67* | (2006.01) |
| *G03F 7/20* | (2006.01) |

(52) U.S. Cl.
CPC ............ *H01L 21/0274* (2013.01); *G03F 7/20* (2013.01); *H01J 37/32009* (2013.01);
(Continued)

(58) Field of Classification Search
CPC .. A01G 25/02; Y02A 40/22; B31B 2120/406; B31B 2120/407; B65D 5/606;
(Continued)

(56) References Cited

U.S. PATENT DOCUMENTS

| | | | |
|---|---|---|---|
| 6,531,404 B1 * | 3/2003 | Nallan | H01L 21/32136 |
| | | | 438/714 |
| 7,029,536 B2 | 4/2006 | Hamelin et al. | |

(Continued)

FOREIGN PATENT DOCUMENTS

JP        5931573 B2    6/2016

OTHER PUBLICATIONS

Korean Intellectual Property Office, The International Search Report and the Written Opinion for International application No. PCT/US2020/031666, dated Aug. 26, 2020, 10 pg.

*Primary Examiner* — Lan Vinh
(74) *Attorney, Agent, or Firm* — Weihrouch IP

(57) ABSTRACT

Embodiments provide a non-plasma etch, such as a gas-phase and/or remote plasma etch, of titanium-containing material layers with tunable selectivity to other material layers. A substrate is received within a process chamber, and the substrate has exposed material layers including a titanium-containing material layer and at least one additional material layer. The additional material layer is selectively etched with respect to the titanium-containing material layer by exposing the substrate to a controlled environment including a halogen-containing gas. For one embodiment, the halogen-containing gas includes a fluorine-based gas. For one embodiment, the titanium-containing material layer is a titanium or a titanium nitride material layer. For one embodiment, the additional material layer includes tungsten, tungsten oxide, hafnium oxide, silicon oxide, silicon-germanium, silicon, silicon nitride, and/or aluminum oxide. A non-selective etch with respect to the titanium-containing material layer can be performed by modulating the process parameters such as temperature.

21 Claims, 5 Drawing Sheets

(52) U.S. Cl.
CPC .... *H01L 21/3065* (2013.01); *H01L 21/67069* (2013.01); *H01J 2237/334* (2013.01)

(58) Field of Classification Search
CPC . G03F 7/20; H01J 2237/334; H01J 37/32009; H01L 21/0274; H01L 21/3065; H01L 21/31122; H01L 21/32135; H01L 21/32136; H01L 21/67069; H01L 21/67109; H01L 21/67103
USPC ....... 438/706, 710, 712, 714, 717, 719, 723, 438/736, 720
See application file for complete search history.

(56) References Cited

U.S. PATENT DOCUMENTS

| | | | |
|---|---|---|---|
| 7,718,032 B2 | 5/2010 | Kent et al. | |
| 8,303,716 B2 | 11/2012 | Wallace et al. | |
| 9,012,331 B2 * | 4/2015 | Moriya | H01L 21/67069 438/706 |
| 2009/0029555 A1 * | 1/2009 | Oh | H01L 27/101 438/703 |
| 2010/0297848 A1 * | 11/2010 | Breitwisch | H01L 45/1683 438/703 |
| 2012/0007221 A1 * | 1/2012 | Huang | H01L 21/32139 257/637 |
| 2012/0202301 A1 * | 8/2012 | Yaegashi | G03F 7/0035 438/8 |
| 2014/0030885 A1 | 1/2014 | Liu et al. | |
| 2015/0262869 A1 * | 9/2015 | Naik | H01L 21/02274 438/643 |
| 2016/0005612 A1 * | 1/2016 | Kikuchi | H01L 21/3065 438/706 |
| 2016/0379835 A1 | 12/2016 | Kal et al. | |
| 2017/0110475 A1 | 4/2017 | Liu et al. | |
| 2018/0097060 A1 | 4/2018 | Zhou | |
| 2018/0240667 A1 * | 8/2018 | Yu | H01L 21/465 |
| 2018/0309055 A1 | 10/2018 | Liu et al. | |

* cited by examiner

NON-PLASMA ETCH OF TITANIUM-CONTAINING MATERIAL LAYERS WITH TUNABLE SELECTIVITY TO ALTERNATE METALS AND DIELECTRICS

RELATED APPLICATIONS

This application claims priority to the following provisional application: U.S. Provisional Patent Application Ser. No. 62/891,115, filed Aug. 23, 2019, entitled "NON-PLASMA ETCH OF TITANIUM-CONTAINING MATERIAL LAYERS WITH TUNABLE SELECTIVITY TO ALTERNATE METALS AND DIELECTRICS," which is hereby incorporated by reference in its entirety.

BACKGROUND

The present disclosure relates to methods for the manufacture of microelectronic workpieces including the formation of patterned structures on microelectronic workpieces.

The fabrication of semiconductor devices within microelectronic workpieces is a multi-step process of forming structures (e.g., electrical gates, contacts, interconnects, etc.) on a semiconductor substrate or other substrate. Steps can include material growth, patterning, doping, deposition, etching, metallization, planarization, and so forth. Features formed on a substrate can include various electronic devices including transistors. Transistors can be planar or non-planar, and can also have single gates or multiple gates.

Various etching processes benefit by being able to etch one material selectively relative to another material so that one material is removed, while another material largely remains on the substrate. For example, photoresist has its name in part because it is a photo-sensitive material that resists being etched by dry plasma etching processes. Photoresist materials are conventionally formed into relief patterns that function as etch masks to allow transferring a pattern into one or more underlying materials.

Titanium (Ti) and titanium nitride (TiN) have been widely used in the semiconductor industry for manufacturing of logic and memory chips. For example, Ti and TiN are commonly used for liners, hard masks, and etch stop materials for many integration or multi-patterning processes. As features sizes are reduced in ten (10) nanometer (nm) technology nodes and below, however, Ti/TiN etch processes are becoming extremely challenging due to high aspect ratio features and stringent etch selectivity requirements. Current etch techniques for Ti/TiN suffer from challenges such as selectivity, pattern damage, pattern collapse, and other challenges. For example, pattern damage can be caused by plasma and remote plasma etch processes, and pattern collapse can be caused by wet etch processes.

SUMMARY

Embodiments are described herein that provide a non-plasma etch, such as a gas-phase etch and/or a remote plasma etch, of titanium-containing material layers with tunable selectivity to other material layers such as alternate metals and dielectrics. For disclosed embodiments, a substrate is received within a process chamber, and the substrate has exposed material layers including a titanium-containing material layer and at least one additional material layer. The additional material layer is selectively etched with respect to the titanium-containing material layer by exposing the substrate to a controlled environment including a halogen-containing gas. For one embodiment, the halogen-containing gas includes a fluorine-based gas. For one embodiment, the titanium-containing material layer is a titanium (Ti) material layer or a titanium nitride (TiN) material layer. For one embodiment, the additional material layer includes at least one of tungsten, tungsten oxide, hafnium oxide, silicon oxide, silicon-germanium, silicon, silicon nitride, or aluminum oxide. Further, a non-selective etch with respect to the titanium-containing material layer can be performed by modulating the process parameters such as temperature and/or other process parameters. Different or additional features, variations, and embodiments can also be implemented, and related systems and methods can be utilized as well.

For one embodiment, a method of etching is disclosed including receiving a substrate within a process chamber, where the substrate has exposed material layers including a titanium-containing material layer and at least one additional material layer, and selectively etching the at least one additional material layer with respect to the titanium-containing material layer by exposing the substrate to a controlled environment including a halogen-containing gas.

In additional embodiments, the selectively etching uses at least one of a gas-phase etch or a remote plasma etch. In further embodiments, the titanium-containing material layer includes titanium or titanium nitride. In further embodiments, the additional material layer includes at least one of tungsten, tungsten oxide, hafnium oxide, silicon oxide, silicon-germanium, silicon, silicon nitride, or aluminum oxide.

In additional embodiments, the method includes controlling process parameters for the process chamber during the selectively etching to achieve target etch parameters. In further embodiments, the method includes controlling a temperature within the process chamber during the selectively etching to be in a temperature range from 35 degrees Celsius to 150 degrees Celsius.

In additional embodiments, the halogen-containing gas includes a fluorine-based gas. In further embodiments, the fluorine-based gas includes chlorine trifluoride, fluorine, or nitrogen trifluoride. In further embodiments, the environment further includes a nitrogen-containing gas.

In additional embodiments, the method includes etching the titanium-containing material layer by exposing the substrate to a second controlled environment. In further embodiments, the method includes controlling process parameters during the etching of the titanium-containing material layer to achieve target etch parameters. In further embodiments, the method includes controlling a temperature for the etching of the titanium-containing material layer to be above 100 degrees Celsius.

In additional embodiments, the method includes receiving the substrate in a second process chamber and forming the second controlled environment in the second process chamber. In further embodiments, the method includes forming the second controlled environment in the process chamber by modulating process parameters within the process chamber.

In additional embodiments, the etching of the titanium-containing material layer also etches a second material layer exposed on the substrate.

For one embodiments, a method of etching is disclosed including receiving a substrate within a process chamber, where the substrate has exposed material layers including a titanium-containing material layer and a tungsten-containing material layer, and selectively etching the tungsten-containing material layer with respect to the titanium-containing material layer by exposing the substrate to a controlled environment including a halogen-containing gas.

In additional embodiments, the selectively etching uses at least one of a gas-phase etch or a remote plasma etch. In further embodiments, the titanium-containing material layer includes titanium or titanium nitride, and wherein the tungsten-containing layer includes tungsten or tungsten oxide.

In additional embodiments, the method includes controlling a temperature within the process chamber during the selectively etching to be below 100 degrees Celsius, and the halogen-containing gas includes a fluorine-based gas.

In additional embodiments, the method includes etching the titanium-containing material layer by modulating process parameters within the process chamber. In further embodiments, the modulating includes increasing a temperature within the process chamber to be at a temperature above 100 degrees Celsius or in a temperature range from 80 degrees Celsius to 150 degrees Celsius. In further embodiments, In additional embodiments, the etching of the titanium-containing material layer also etches a second material layer exposed on the substrate.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 1A provides a cross-section view of an example embodiment where a selective etch process is selective to a material layer with respect to titanium-containing material layer.

FIG. 1B provides a cross-section view of an example embodiment after the selective etch process of FIG. 1A.

FIG. 1C provides a cross-section view of an example embodiment where a non-selective etch process etches a material layer and a titanium-containing material layer.

FIG. 1D provides a cross-section view of an example embodiment after the non-selective etch process of FIG. 1C.

DETAILED DESCRIPTION

Figure 2:
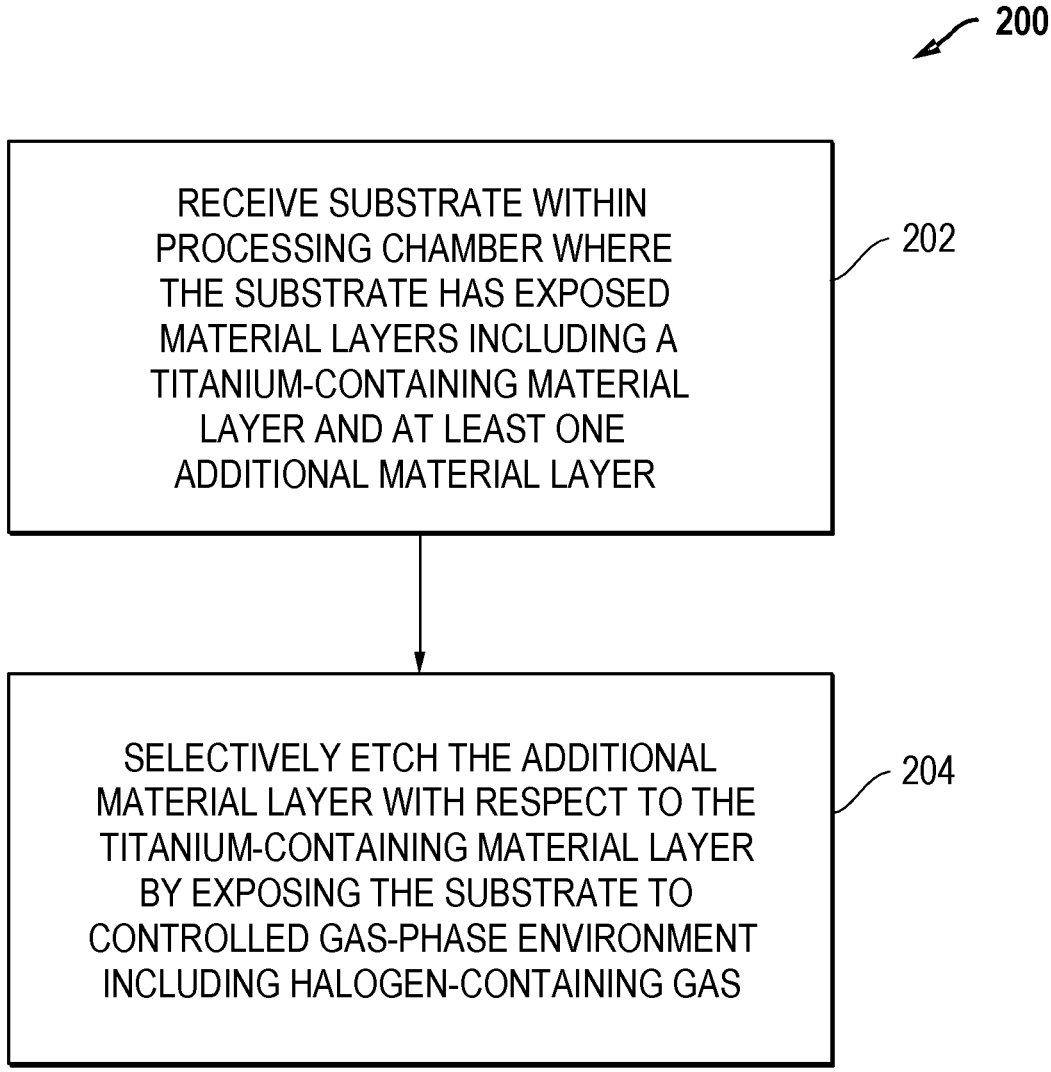
FIG. 2 is a process flow diagram of an example embodiment where a selective etch process is selective to a material layer with respect to a titanium-containing material layer.

Methods are described herein that provide a non-plasma etch, such as a gas-phase etch and/or a remote plasma etch, of titanium-containing material layers with tunable selectivity to other material layers such as alternate metals and dielectrics. A variety of advantages and implementations can be achieved while still taking advantage of the process techniques described herein.

It is initially noted that the term "non-plasma" generally means that a plasma is not formed in a space proximate the microelectronic workpiece being processed or treated, for example, within the processing chamber where the microelectronic workpiece is positioned for a etch process. As such, the microelectronic workpiece is considered to be processed or treated within a non-plasma or plasma free environment. For remote plasma processes, products of plasma are introduced from a remote location to the environment proximate the microelectronic workpiece being processed or treated. As plasma is still not actively being generated (e.g., by an electromagnetic field) adjacent the microelectronic workpiece being processed or treated, a remote plasma etch is still considered herein to be a "non-plasma" etch.

The disclosed embodiments provide selective non-plasma etch of titanium-containing material layers such as titanium (Ti) material layers and titanium nitride (TiN) material layers. In addition, these etch processes are isotropic and provide selective etch for high aspect ratio structures and patterns. For one embodiment, a fluorine-based gas is used for gas chemistries. For one embodiment, this fluorine-based gas can be a fluorine-based inter-halogen gas. For example, the fluorine-based inter-halogen gas can be chlorine trifluoride ($ClF_3$), fluorine ($F_2$), nitrogen trifluoride ($NF_3$), and/or other fluorine-based inter-halogen gas. Further, the fluorine-based gas can be combined with or without a nitrogen-containing gas as an etchant. The nitrogen-containing gas can be nitrogen trihydride ($NH_3$), nitrogen ($N_2$), or other nitrogen-containing gas. Still further, the titanium etch selectivity can be modulated or adjusted with respect to other exposed materials to provide selective or non-selective etching with respect to these other exposed materials. For example, the other exposed materials or films can be tungsten (W), tungsten oxide ($WO_3$), hafnium oxide (HfO), silicon oxide ($SiO_2$), silicon-germanium (SiGe), silicon (Si), silicon nitride ($Si_xN_y$), aluminum oxide ($AlO_x$), an organic planarization layer (OPL), an organic dielectric layer (ODL), and/or other materials. This ability to modulate between selective and non-selective etching is useful for a wide variety of processes including interconnect patterning. As further described below, the modulation from selective etch to non-selective etch of a titanium-containing material layer with respect to other materials layers can be achieved by adjusting process temperatures and/or other process parameters. Other variations can also be implanted while still taking advantage of the techniques described herein.

Figures 1A, 1B, 1C, 1D:
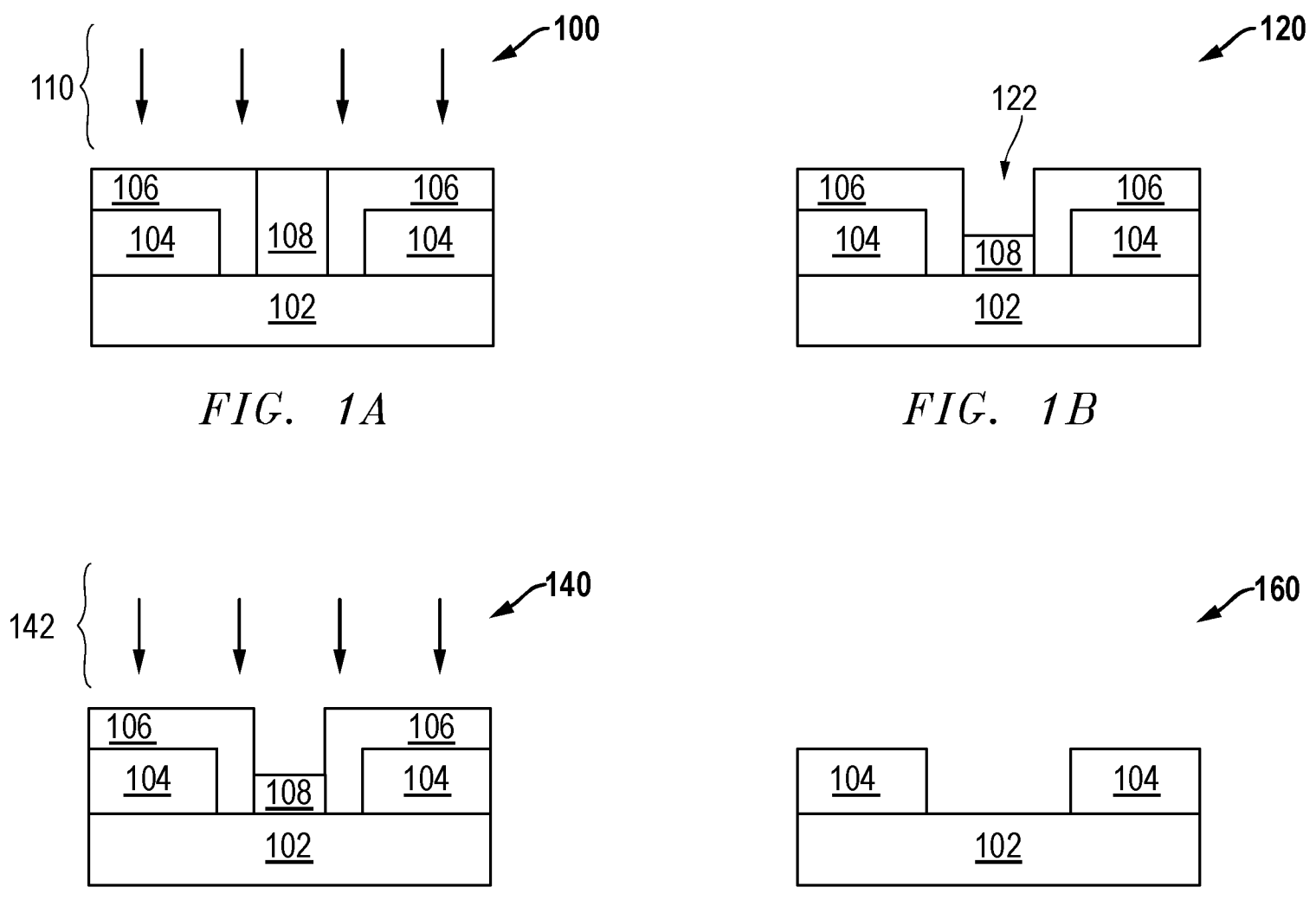

FIGS. 1A-1D provide an example embodiment for etch processes with respect to a titanium-containing material layer. These etch processes provide the ability to modulate between a selective etch with respect to the titanium-containing material layer and a non-selective etch with respect to the titanium-containing material layer. These etch processes can be achieved, for example, using dry-etch gas-phase environment chemistries without the need for plasma, wet chemicals, or chemical mechanical polishing (CMP). For the selective etch process described below with respect to FIG. 1A, etch selectivity is provided with respect a titanium-containing material layer and another material layer. The titanium-containing material layer can include titanium (T), titanium nitride (TiN), and/or other titanium-containing materials. The other material can include tungsten (W), tungsten oxide ($WO_3$), hafnium oxide (HfO), silicon oxide (SiO$_2$), silicon-germanium (SiGe), silicon (Si), silicon nitride (Si$_x$N$_y$), aluminum oxide (AlO$_x$), an organic planarization layer (OPL), an organic dielectric layer (ODL), and/or other materials. For one embodiment, a selective etch of a tungsten-containing material is be implemented that is plasma free and isotropic. Remote plasma etch processes can also be used. The process parameters can also be controlled to achieve target etch parameters, and the selectivity can be tuned through modulation of the process parameters.

Looking now to FIG. 1A, a cross-section view is provided of an example embodiment 100 where a selective etch process 110 is applied to material layers for a structure formed on a substrate 102 and where the selective etch process 110 is selective to a material layer 108 with respect to a titanium-containing material layer 106. The titanium-containing material layer 106 is formed over a first material layer 104, and a second material layer 108 is formed above the substrate 102 within a via through the titanium-containing material layer 106. For one embodiment, the substrate 102 is Si or SiGe, and the first material layer 104 is silicon oxide (SiO$_2$), although other materials could also be used. The titanium-containing layer material 106 includes Ti, TiN, or another titanium-containing material or combination of materials. The second material layer 108 is W, WO$_3$, HfO, SiO$_2$, SiGe, Si, Si$_x$N$_y$, AlO$_x$, OPL, ODL, and/or other materials or combinations of materials. As described herein, the selective etch process 110 provides a selective etch of an exposed material layer with respect to the titanium-containing material layer 106 under controlled process parameters to reach target etch parameters.

For one embodiment, the selective etch process 110 is achieved using an anhydrous inter-halogen and/or another halogen-containing gas such as ClF$_3$, F$_2$, NF$_3$, or other halogen-containing gas. One or more of these halogen-containing gases can be used in combination with diluent gases such as N$_2$, argon (Ar), and/or other diluent gases. For one embodiment, the etch process 110 is performed at a pressure from 10 millitorrs (mT) to 3000 mT and a temperature range from 35 degrees Celsius (° C.) to 150° C. As described herein, it has been found that reaction byproducts for an etch process with these gas chemistries is volatile at temperatures above 100° C. under reduced pressure.

FIG. 1B provides a cross-section view of an example embodiment 120 after the selective etch process 110 of FIG. 1A has selectively etched a portion of the second material layer 108 within opening 122 with respect to the titanium-containing material layer 106. The selective etch process 110 can be used to achieve a target etch parameter for the etch of the second material layer 108.

FIG. 1C provides a cross-section view of an example embodiment 140 where a further etch process 142 is applied that is non-selective to the second material layer 108 with respect to the titanium-containing material layer 106. For this further etch process 142, the process parameters are modulated so that the titanium-containing material layer 106 is etched along with the second material layer 108. For example, temperature and/or pressure or other process parameters within the process chamber can be modulated to conditions sufficient to etch the titanium-containing material layer 106. As described herein, this non-selective etch process 142 provides an etch of a material layer and the titanium-containing material layer 106 under controlled process parameters to reach target etch parameters.

FIG. 1D provides a cross-section view of an example embodiment 160 after the non-selective etch process 142 of FIG. 1C has etched the second material layer 108 and the titanium-containing material layer 106. The etch process 110 can be used to achieve a target etch parameter for the etch of the second material layer 108.

With respect to FIG. 1A and FIG. 1C, it is shown that the etch processes can be modulated between a selective etch process 110 as shown in FIG. 1A and a non-selective etch process 142 as shown in FIG. 1C. This etch modulation is achieved with the process chemistries described above by tuning the process temperature, pressure, and/or other process parameters. This etch modulation is beneficial, for example, when multiple materials (e.g., W, WO$_3$, SiGe, Si, etc.) are desired to be selectively or non-selectively etched with respect to a titanium-containing material (e.g., Ti, TiN, etc.). As compared to the selective etch process 110, the ratio of etch gases to diluent gasses for the non-selective etch process 142 can be modulated to achieve a uniform and isotropic etch of the titanium-containing material layer 106. Furthermore, the gas pressure inside the chamber can be controlled to tune the etch rate to improve throughput and to account for any over etch that may be needed. In addition, for the selective etch process 110, process parameters such as temperature and concentration of etch gases can be modulated to achieve selectivity to other material layers with respect to titanium-containing material layer 106.

It is noted that the non-selective etch process 142 described herein can be driven in part by adsorption of a halogen-containing gas (e.g., ClF$_3$) on the surface of an exposed titanium-containing material layer 106 during the selective etch process 110 and sublimation at a suitable temperature (e.g., generally 100° C. or above). This absorption activates the surface of the titanium-containing material to form a composition of titanium-halide as byproduct. At increased temperatures, such as above 100° C., this titanium-halide byproduct becomes volatile. The etch and reaction rate are primarily controlled by three factors: (1) temperature, (2) rate of adsorption on the surface, and (3) availability or concentration of the etch gases. Concentration of etch gasses can be controlled by tuning the etch gas flow, adding diluents (e.g., N$_2$, Ar, etc.), chamber pressure, and/or adjusting other process parameters. It is further noted that the etch process 110 can be also be carried out under remote plasma using halide gases. Other variations can also be implemented.

Looking back to FIG. 1C, the non-selective etch process 142 sublimates the titanium-halide byproduct produced from the selective etch process 110 in FIG. 1A. In this non-selective etch process 142, the semiconductor substrate is heated at an elevated temperature equal to or above 100° C. under reduced pressure of 10 mT to 3000 mT. During this non-selective etch process 142, the titanium-halide byproduct sublimates, and underlying films or pattern structures are exposed for subsequent processes as shown in FIG. 1D. It is further noted that by appropriate control of process parameters within a process chamber, such as process temperature and pressure tuning, the selective etch process 110 and the non-selective etch process 142 can be performed in a single process chamber. Different process chambers could also be used. Other variations can be implemented while still taking advantage of the techniques described herein.

For one embodiment, the second material layer 108 is a tungsten-containing material (e.g., W, WO$_3$, etc.). For the selective etch process 110 in FIG. 1A, a process temperature below 100° C. and preferably below 80° C. is used to selectively etch only the tungsten-containing material layer 108 with selectivity to the titanium-containing material layer 106. For the non-selective etch process 142 in FIG. 1C, a process temperature of above 80° C. and preferably above 100° C. is used to etch both the tungsten-containing material layer 108 and the titanium-containing material layer 106. Further, a temperature range from 80° C. to 150° C. and preferably from 100° C. to 150° C. can be used for this non-selective etch process 142. A pressure range for the selective etch process 110 and/or the non-selective etch process 142 can be 10 mT to 3000 mT. Other variations can be implemented while still taking advantage of the techniques described herein.

FIG. 2 is a process flow diagram of an example embodiment 200 where a selective etch process is applied to material layers for a structure formed on a substrate and where the selective etch process is selective to a material layer with respect to a titanium-containing material layer. In block 202, a substrate is received within a process chamber, and the substrate has exposed material layers including a titanium-containing material layer and at least one additional material layer. In block 204, the at least one additional material layer is selectively etched with respect to the titanium-containing material layer by exposing the substrate to a controlled environment including a halogen-containing gas. As further described herein, the process parameters for the process chamber can then be modulated to etch the titanium-containing material layer in a further etch process. A separate process chamber can also be used. Additional and/or different process steps can also be implemented while still taking advantage of the techniques described herein.

It is further noted that the techniques described herein may be utilized with a wide range of processing systems including gas-phase and remote plasma processing environments. For example, the etch processes described herein can be performed by placing a substrate for microelectronic workpiece to be processed in a tandem chamber etching system, such as the system described in FIGS. 3-5, or the system described in U.S. Pat. No. 7,029,536, entitled "Processing system and method for treating a substrate," or U.S. Pat. No. 8,303,716, entitled "High throughput processing system for chemical treatment and thermal treatment and method of operating. The etch processes described herein can also be performed by placing a substrate for a microelectronic workpiece to be processed in a single chamber etching system, such as the system to be described in FIGS. 6-7, or the system described in U.S. Pat. No. 7,718,032, entitled "Dry non-plasma treatment system and method of using;" or U.S. Published Patent Application No. 2016/0379835, entitled "Gas Phase Etching System and Method." U.S. Pat. Nos. 7,029,536; 8,303,716, 7,718,032; and U.S. Published Patent Application No. 2016/0379835 are each hereby incorporated by reference in its entirety.

Figure 3:
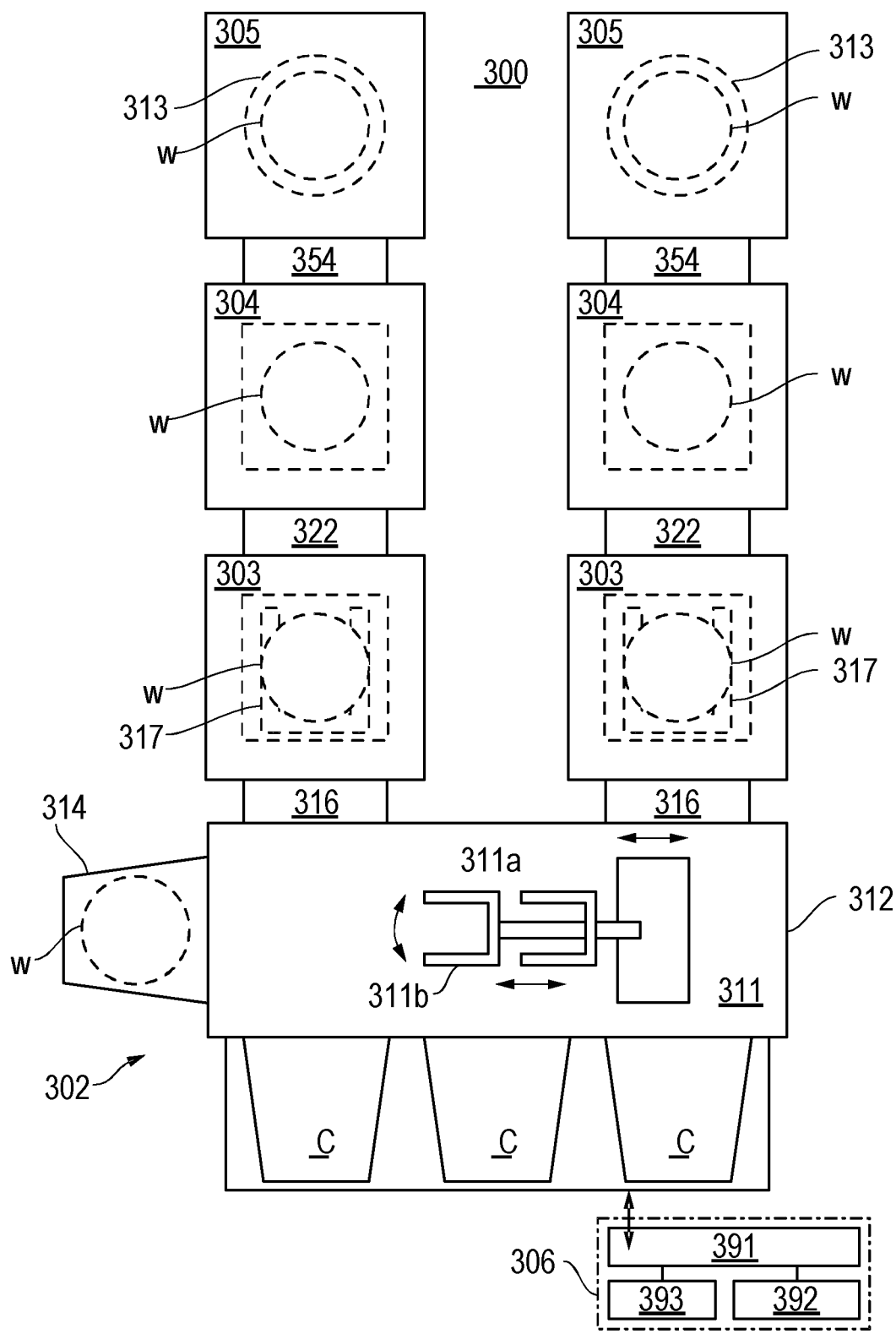
FIG. 3 provides a schematic illustration of a gas-phase etching system according to an embodiment.

Looking now to FIG. 3, a schematic configuration view is shown for one example of a processing system equipped with an etching system that performs an etching method according to one embodiment of the present disclosure. A processing system 300 in part includes a control part 306 and a loading/unloading part 302 configured to load and unload a semiconductor substrate (hereinafter simply referred to as a wafer "W") as a target substrate. The process system 300 also includes two load lock chambers (L/L) 303 disposed adjacent to the loading/unloading part 302 and two heat treatment apparatuses 304 (e.g., thermal treatment chambers) disposed adjacent to the corresponding load lock chambers 303 and configured to perform a heat treatment with respect to the wafer W. Further, the process system 300 includes two etching apparatuses 305 (e.g., chemical treatment chambers) that are disposed adjacent to the corresponding heat treatment apparatuses 304 and configured to perform etching with respect to the wafer W.

The loading/unloading part 302 includes a transfer chamber (L/M) 312, within which a first wafer transfer mechanism 311 for transferring the wafer W is installed. The first wafer transfer mechanism 311 includes two transfer arms 311a and 311b configured to hold the wafer W in a substantially horizontal position. A mounting stage 313 is installed at one longitudinal side of the transfer chamber 312. The mounting stage 313 is configured to connect one or more, for example, three, substrate carriers C capable of accommodating a plurality of wafers W. In addition, a substrate orientation device 314 configured to perform a position alignment by rotating the wafer W, and locating reference point thereon is installed adjacent to the transfer chamber 312.

In the loading/unloading part 302, the wafer W is held by one of the transfer arms 311a and 311b, and is moved linearly within a substantially horizontal plane, or moved up and down by the operation of the first wafer transfer mechanism 311, thereby being transferred to a desired position. Further, the wafer W is loaded or unloaded with respect to the carriers C mounted on the mounting stage 313, the orientation device 314, and the load lock chambers 303, as the transfer arms 311a and 311b move toward or away from the substrate carriers C, the orientation device 314 and the load lock chambers 303.

Each of the load lock chambers 303 is connected to the transfer chamber 312 with a gate valve 316 interposed between each of the load lock chambers 303 and the transfer chamber 312. A second wafer transfer mechanism 317 for transferring the wafer W is installed within each of the load lock chambers 303. Each of the load lock chambers 303 is configured such that it can be evacuated to a predetermined vacuum degree.

The second wafer transfer mechanism 317 has an articulated arm structure and includes a pick configured to hold the wafer W in a substantially horizontal position. In the second wafer transfer mechanism 317, the pick is positioned within each of the load lock chambers 303, when an articulated arm is retracted. The pick can reach a corresponding heat treatment apparatus 304 as the articulated arm is extended, and can reach a corresponding etching apparatus 305 as the articulated arm is further extended. Thus, the second wafer transfer mechanism 317 can transfer the wafer W between the load lock chamber 303, the heat treatment apparatus 304, and the etching apparatus 305.

Figure 4:
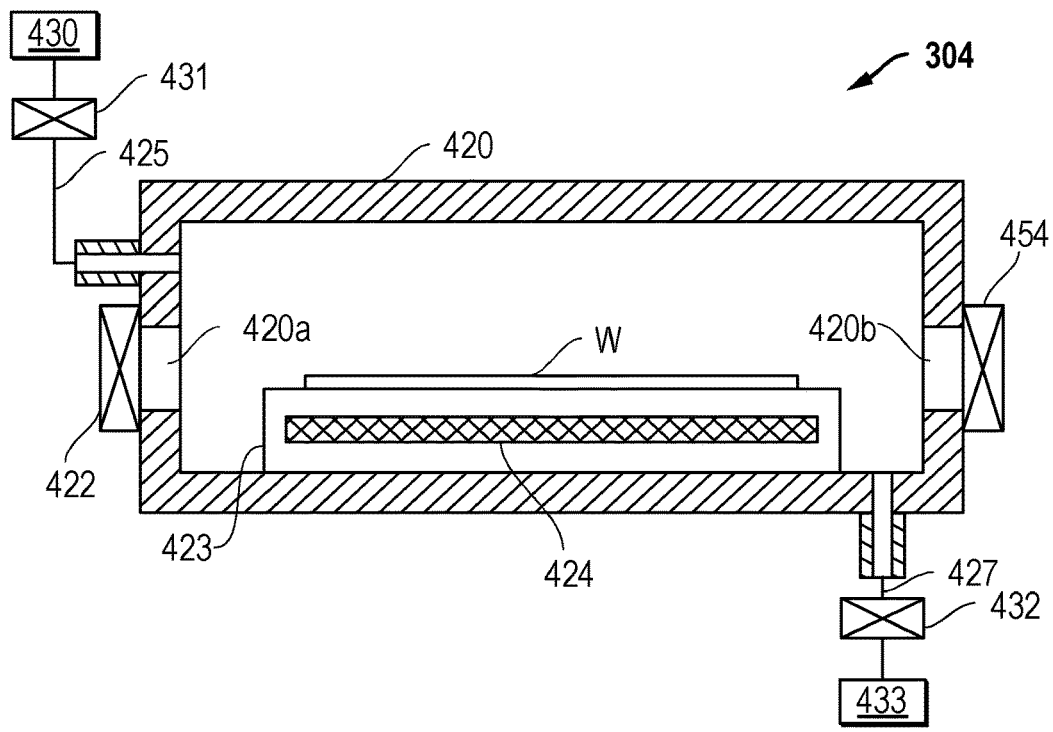
FIG. 4 provides a schematic illustration of a thermal treatment module according to an embodiment.

As shown in FIG. 4, each of the heat treatment apparatuses 304 includes a vacuum-controlled chamber 420, and a mounting table 423 configured to mount the wafer W within the chamber 420. A heater 424 is embedded in the mounting table 423. After being subjected to an etching process, the wafer W is heated by the heater 424, thereby vaporizing and removing etching residue that exists on the wafer W. A loading/unloading gate 420a through which the wafer W is transferred between the heat treatment apparatuses 304 and corresponding load lock chambers 303 is installed in the sidewall of the chamber 420, adjoining the load lock chamber 303. The loading/unloading gate 420a is opened and closed by a gate valve 422. In addition, a loading/unloading gate 420b, through which the wafer W is transferred between the heat treatment apparatuses 304 and corresponding etching apparatuses 305, is installed in the sidewall of the chamber 420 adjoining the etching apparatus 305. The loading/unloading gate 420b is opened and closed by a gate valve 454. A gas supply path 425 is connected to an upper portion of the sidewall of the chamber 420. The gas supply path 425 is connected to an inert gas, i.e., $N_2$, gas supply source 430. An exhaust path 427 is connected to the bottom wall of the chamber 420. The exhaust path 427 is connected to a vacuum pump 433. A flow rate adjusting valve 431 is installed in the gas supply path 425. A pressure adjusting valve 432 is installed in the exhaust path 427. By controlling the flow rate adjusting valve 431 and the pressure adjusting valve 432, the interior of the chamber 420 is kept in an inert, or nitrogen, gas atmosphere having a predetermined pressure. In this state, a heat treatment is performed. Instead of the $N_2$ gas, other inert gases, such as Ar gas or the like, may be used.

Looking back to FIG. 3, the control part 306 includes a process controller 391 provided with a microprocessor (computer) which controls the respective constituent parts of the processing system 300. A user interface 392, which includes a keyboard that allows an operator to perform a command input operation or the like in order to manage the processing system 300, and a display that visualizes and displays an operation status of the processing system 300, is connected to the process controller 391. Also connected to the process controller 391 is a storage part 393 that stores control programs that realize, under the control of the process controller 391, various types of processes performed in the processing system 300. For example, the process controller 391 can cause supply of a treatment gas and evacuation of the interior of the chamber in each of the etching apparatuses 305. The storage part 393 can also store various types of databases and process recipes that are control programs to cause the respective constituent parts of the processing system 300 to perform specified processes according to process conditions. The recipes are stored in a suitable storage medium (not shown) of the storage part 393. If necessary, an arbitrary recipe is called out from the storage part 393 and is executed by the process controller 391. In this way, desired processes are performed in the processing system 300 under the control of the process controller 391.

The etching apparatuses 305, according to an embodiment, are configured to perform selective etching of at least one material layer with respect to a titanium-containing material layer as described herein. A detailed example configuration of the etching apparatuses 305 will be described later.

In the processing system 300, a wafer including a titanium-containing material layer and at least one other material layer are exposed on the wafer W. A plurality of wafers W of this type are loaded within the substrate carriers C, and are transferred to the processing system 300.

In the processing system 300, one of the wafers W is transferred from the substrate carriers C mounted in the loading/unloading part 302 to one of the load lock chambers 303 by one of the transfer arms 311a and 311b of the first wafer transfer mechanism 311, while keeping the atmospheric-side gate valve 316 open. The wafer W is delivered to the pick of the second wafer transfer mechanism 317 disposed within the load lock chamber 303.

Thereafter, the atmospheric-side gate valve 316 is closed and the interior of the load lock chamber 303 is evacuated. Subsequently, the gate valve 354 is opened and the pick is extended into a corresponding etching apparatus 305, so that the wafer W is transferred to the etching apparatus 305.

Thereafter, the pick is returned to the load lock chamber 303 and the gate valve 354 is closed. Then, an etching process is performed within the etching apparatus 305 in the manner described below.

After the etching process is completed, the gate valves 322 and 354 are opened. The etched wafer W is transferred to the heat treatment apparatus 304 by the pick of the second wafer transfer mechanism 317. While $N_2$ gas is introduced into the chamber 320, the wafer W mounted on the mounting table 323 is heated by the heater 324, thereby thermally removing etching residue or the like.

After the heat treatment is completed in the heat treatment apparatus 304, the gate valve 322 is opened. The etched wafer W mounted on the mounting table 323 is moved to the load lock chamber 303 by the pick of the second wafer transfer mechanism 318. Then, the etched wafer W is returned to one of the carriers C by one of the transfer arms 311a and 311b of the first wafer transfer mechanism 311. Thus, a process for one wafer is completed.

In the processing system 300, the heat treatment apparatuses 304 are not essential. In cases where no heat treatment apparatus is installed at the processing system 300, the wafer W after being subjected to the etching process may be moved to one of the load lock chambers 303 by the pick of the second wafer transfer mechanism 317. The wafer W can then be returned to one of the carriers C by one of the transfer arms 311a and 311b of the first wafer transfer mechanism 311.

Figure 5:
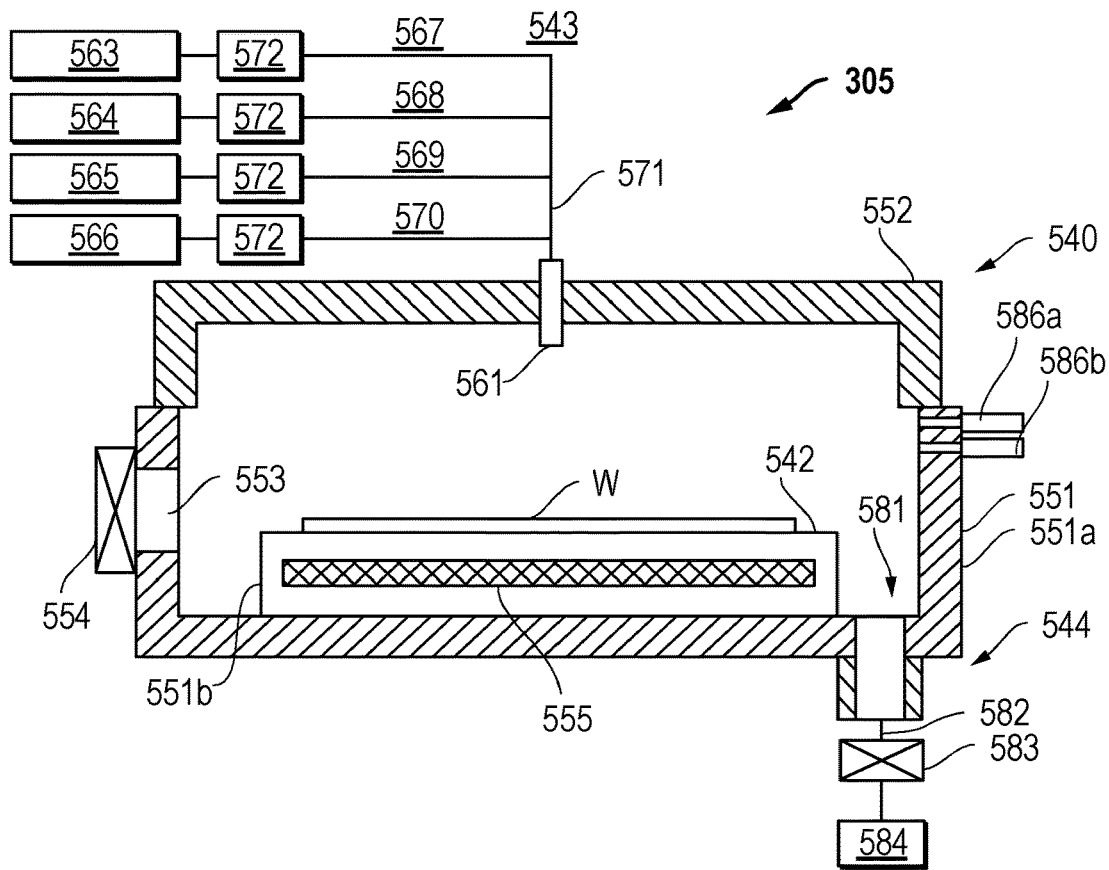
FIG. 5 provides a schematic illustration of a chemical treatment module according to an embodiment.

FIG. 5 is a sectional view showing an example embodiment for the etching apparatus 305 according to the present embodiment. As shown in FIG. 5, the etching apparatus 305 includes a chamber 540 having a sealed structure. A mounting table 542 configured to mount the wafer W in a substantially horizontal position is installed within the chamber 540. The etching apparatus 305 further includes a gas supply mechanism 543 configured to supply an etching gas to the chamber 540 and an evacuation mechanism 544 configured to evacuate the interior of the chamber 540.

The chamber 540 is configured by a chamber body 551 and a cover portion 552. The chamber body 551 includes a substantially cylindrical sidewall portion 551a and a bottom portion 551b. The upper portion of the chamber body 551 is opened. This opening is closed by the cover portion 552. The sidewall portion 551a and the cover portion 552 are sealed by a seal member (not shown), thereby securing the airtightness of the interior of the chamber 540. A gas introduction nozzle 561 is inserted through the ceiling wall of the cover portion 552 so as to extend from above toward the interior of the chamber 540.

A loading/unloading gate 553 through which the wafer W is loaded and unloaded between the chamber 540 of the etching apparatus 305 and the chamber 420 of the heat treatment apparatus 304 is installed in the sidewall portion 551a. The loading/unloading gate 553 is opened and closed by a gate valve 554.

The mounting table 542 has a substantially circular shape (however, the shape can be arbitrary) when viewed from the top, and is fixed to the bottom portion 551b of the chamber 540. A temperature controller 555 configured to control the temperature of the mounting table 542 is installed within the mounting table 542. The temperature controller 555 includes a conduit through which a temperature control medium (e.g., water, etc.) circulates. By heat exchange between the mounting table 542 and the temperature control medium flowing through the conduit, the temperature of the mounting table 542 is controlled, and hence, the temperature of the wafer W mounted on the mounting table 542 is controlled.

The gas supply mechanism 543 can include multiple gas supplies 563, 564, 565, 566, for example, including a gas supply for an interhalogen compound. The gas supply mechanism 543 further includes multiple supply lines 567, 568, 569, 570, for example, for pneumatically coupling the gas supplies to one or more gas lines 571 and gas injection nozzles 561.

Flow rate controllers 571 are configured to perform a flow path opening/closing operation, and a flow rate control for each gas supplied to the chamber 540. A shower plate may be installed in the upper portion of the chamber 540 to supply excited gases in a shower-like manner.

The evacuation mechanism 544 includes an exhaust duct 582 connected to an exhaust port 581 formed in the bottom portion 551*b* of the chamber 540. The evacuation mechanism 544 further includes an automatic pressure control valve (APC) 583, which is installed in the exhaust duct 582, and configured to control the internal pressure of the chamber 540, and a vacuum pump 584 configured to evacuate the interior of the chamber 540.

In the sidewall of the chamber 540, two capacitance manometers 586*a* and 586*b*, as pressure gauges for measuring the internal pressure of the chamber 540, are installed such that the capacitance manometers 586*a* and 586*b* are inserted into the chamber 540. The capacitance manometer 586*a* is used to measure a high pressure, while the capacitance manometer 586*b* is used to measure a low pressure. A temperature sensor (not shown) for detecting the temperature of the wafer W is installed near the wafer W mounted on the mounting table 542.

Aluminum is used as the material of the respective constituent parts, such as the chamber 540 and the mounting table 542, which constitute the etching apparatus 305. The aluminum material that constitutes the chamber 540 may be a pure aluminum material or an aluminum material having an anodized inner surface (the inner surface of the chamber body 551, etc.). On the other hand, the surface of the aluminum material that constitutes the mounting table 542 requires wear resistance. Therefore, an oxide film (e.g., $Al_2O_3$ film) having high wear resistance may be applied in some embodiments on the surface of the aluminum material by anodizing the aluminum material.

Figure 6:
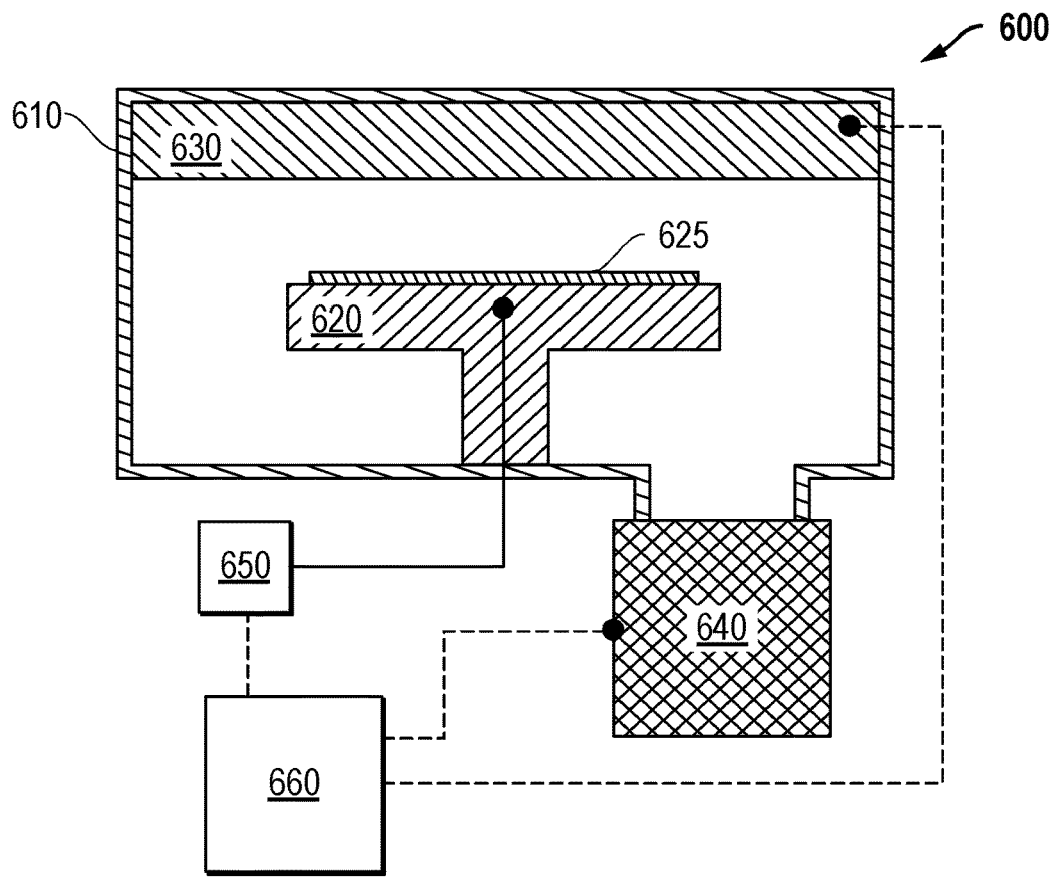
FIG. 6 provides a schematic illustration of an etching system according to another embodiment.

For another example system embodiment, a workpiece is placed on a substrate holder in a single chamber etching system (e.g., a dry, non-plasma etch system, or chemical and/or thermal treatment chamber), for example, as show in FIG. 6. The single chamber, etching system is operated to perform the following: (1) exposing the surface of the workpiece to a chemical environment at a first set-point temperature for a selective etch of at least one material layer with respect to a titanium-containing material layer, and (2) then, elevating the temperature of the workpiece to a second set-point temperature to remove the titanium-containing material layer as well as other material layers in a non-selective etch.

The first set-point temperature can be established by flowing a heat transfer fluid through the workpiece holder at a first fluid set-point temperature. The second set-point temperature can be established by flowing the heat transfer fluid through the workpiece holder at a second fluid set-point temperature. In addition to flowing the heat transfer fluid through the workpiece holder at the second fluid set-point temperature, the substrate holder can be heated by coupling electrical power to at least one resistive heating element embedded within the workpiece holder. Alternatively, in addition to flowing the heat transfer fluid through the workpiece holder at the second fluid set-point temperature, heating the workpiece holder using at least one other heat source separate from the workpiece holder.

Looking further to FIG. 6, another embodiment in the form of an etching system 600 is shown for the dry removal of a material on a microelectronic substrate 625. The system 600 includes a process chamber 610 for processing substrate 625 in a non-plasma, vacuum environment. The system 600 also includes a substrate holder 620 arranged within the process chamber 610 and configured to support the substrate 625, a temperature control system 650 coupled to the substrate holder 620 and configured to control the temperature of the substrate holder 620 at two or more set-point temperatures, a gas distribution system 630 coupled to the process chamber 610 and arranged to supply one or more process gases into the process chamber 610, and a controller 660 operably coupled to the temperature control system 650 and configured to control the temperature of the substrate holder 620 ranging from 35° C. to 250° C. For example, the temperature control system 650 can be configured to control the temperature of the substrate holder 620 at a first set-point temperature, and adjust and control the temperature of the substrate holder 620 at a second set-point temperature.

The process chamber 610 can include a vacuum pump 640 to evacuate process gases from process chamber 610. The process chamber 610 can further include a remote plasma generator or remote radical generator arranged to supply the process chamber with excited, radical or metastable species, or combinations thereof.

Gas distribution system 630 can include a showerhead gas injection system having a gas distribution assembly, and one or more gas distribution plates or conduits coupled to the gas distribution assembly and configured to form one or more gas distribution plenums or supply lines. Although not shown, the one or more gas distribution plenums may include one or more gas distribution baffle plates. The one or more gas distribution plates further include one or more gas distribution orifices to distribute a process gas from the one or more gas distribution plenums to the process chamber 610. Additionally, one or more gas supply lines may be coupled to the one or more gas distribution plenums through, for example, the gas distribution assembly in order to supply a process gas including one or more gases. Process gases can be introduced together as a single flow, or independently as separate flows.

Gas distribution system 630 can further include a branching gas distribution network designed to reduce or minimize gas distribution volume. The branching network can remove plenums, or minimize the volume of gas plenums, and shorten the gas distribution length from gas valve to process chamber, while effectively distributing the process gas across the diameter of the substrate 625. In doing so, gases can be switched more rapidly, and the composition of the chemical environment can be changed more effectively.

The volume of the process chamber 610 defining the chemical environment, to which the substrate 625 is exposed, can be reduced or minimized in order to reduce or minimize the residence time or time required to evacuate, displace, and replace one chemical environment with another chemical environment. The time to displace the chemical environment in the process chamber 610 can be estimated as the ratio of the process chamber volume to the pumping speed delivered to the process chamber volume by the vacuum pump 640.

Substrate holder 620 can provide several operational functions for thermally controlling and processing substrate 625. The substrate holder 620 includes one or more temperature control elements configured to adjust and/or elevate a temperature of the substrate 620.

Figure 7:
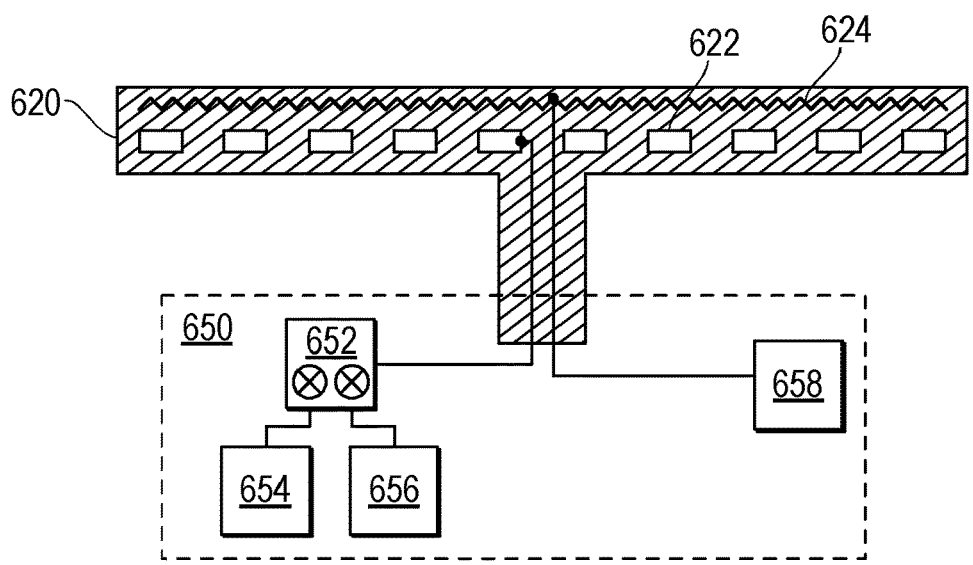
FIG. 7 provides a schematic illustration of a workpiece holder according to an embodiment.

As shown in FIG. 7, substrate holder 620 can include at least one fluid channel 622 to allow flow of a heat transfer fluid there through and alter a temperature of the substrate holder 620. Substrate holder 620 can further include at least one resistive heating element 624. Multi-zone channels and/or heating elements can be used to adjust and control the spatial uniformity of heating and cooling of substrate 625. For example, the at least one resistive heating element 624 can include a central-zone heating element and an edge-zone heating element. Additionally, for example, the at least one fluid channel 622 can include a central-zone fluid channel and an edge-zone fluid channel. At temperatures above 200 to 250° C., other heating systems can be used, including infrared (IR) heating, such as lamp heating, etc.

A power source 658 is coupled to the at least one resistive heating element 624 to supply electrical current. The power source 658 can include a direct current (DC) power source or an alternating current (AC) power source. Furthermore, the at least one resistive heating element 624 can be connected in series or connected in parallel.

The at least one heating element 624 can, for example, include a resistive heater element fabricated from carbon, tungsten, nickel-chromium alloy, aluminum-iron alloy, aluminum nitride, etc. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). According to one example, each of the at least one resistive heating element 624 can include a heating element, commercially available from Watlow Electric Manufacturing Company (12001 Lackland Road, St. Louis, Mo. 63146). Alternatively, or in addition, cooling elements can be employed in any of the embodiments.

A heat transfer fluid distribution manifold 652 is arranged to pump and monitor the flow of heat transfer fluid through the one or more fluid channels 622. The heat transfer fluid distribution manifold 652 can draw heat transfer fluid from a first heat transfer fluid supply bath 654 at a first heat transfer fluid temperature and/or a second heat transfer fluid supply bath 656 at a second heat transfer fluid temperature. Manifold 652 can mix heat transfer fluid from the first and second fluid baths 654, 656 to achieve an intermediate temperature. Furthermore, the heat transfer fluid distribution manifold 652 can include a pump, a valve assembly, a heater, a cooler, and a fluid temperature sensor to controllably supply, distribute, and mix a heat transfer fluid at a predetermined temperature.

In an alternative embodiment, the temperature control system 660 can include a hot wall in close proximity to the work piece holder 620. The substrate holder 620 can further include a substrate clamping system configured to clamp the substrate to the substrate holder, and a backside gas supply system configured to supply a heat transfer gas to the backside of the substrate.

The heat transfer fluid can include a high temperature fluid having a boiling point exceeding 200° C. For example, the heat transfer fluid can include Fluorinert FC40 (having a temperature range of −57 to 165° C.), or Fluorinert FC70 (having a temperature range of −25 to 215° C.), commercially available from 3M.

Substrate holder 620 can be monitored using a temperature-sensing device, such as a thermocouple (e.g. a K-type thermocouple, Pt sensor, etc.) or optical device. Furthermore, the temperature control system 650 for the substrate holder may utilize the temperature measurement as feedback to the substrate holder 620 in order to control the temperature of substrate holder 620. For example, at least one of a fluid flow rate, a fluid temperature, a heat transfer gas type, a heat transfer gas pressure, a clamping force, a resistive heater element current or voltage, a thermoelectric device current or polarity, etc. may be adjusted in order to affect a change in the temperature of substrate holder 620 and/or the temperature of the substrate 625.

As noted above, controller 660 is operably coupled to the temperature control system 650, and configured to control the temperature of various components in etching system 600, including the substrate holder 620, at temperatures ranging from 10° C. to 250° C., or 35° C. to 250° C., or 50° C. to 250° C. For example, under instruction of controller 660, the temperature control system 650 can be configured to control the temperature of the substrate holder 620 at a first set-point temperature, and adjust and control the temperature of the substrate holder 320 at a second set-point temperature. The temperature control system 650 can obtain temperature information from one or more temperature sensors arranged to measure the temperature of the substrate holder 620, the substrate 625, the chamber wall of the process chamber 610, or the temperature of the gas distribution system 630, among others, and utilize the temperature information to controllably adjust these temperatures.

As an example, when changing the temperature of the substrate holder 620 from the first set-point temperature to the second set-point temperature, the fluid temperature of the heat transfer temperature can be adjusted rapidly by changing the ratio of heat transfer fluid drawn from the heat transfer fluid supply baths 654, 656. Once within a predetermined range of the targeted second set-point temperature, the at least one resistive heating element can be utilized to accurately control the set-point temperature. The substrate holder 620 can be designed to have a relatively low thermal mass. For example, the thickness of the holder and material composition of the holder can be designed to reduce or minimize the thermal mass of the holder. Furthermore, the at least one fluid channel 622, including the fluid conduits supplying heat transfer fluid to the at least one fluid channel 622, can be designed to have low volume in order to change fluid temperature rapidly. For example, the length and diameter of the fluid channels and conduits can be designed to reduce or minimize volume (i.e., reduce the time necessary to displace fluid of one temperature, and replace it with fluid of another temperature).

Other chamber components of process chamber 610, including chamber walls, the gas distribution system 630, etc., can include heating and/or cooling elements to control the temperature thereof. For example, the chamber wall temperature of the process chamber 610 and the temperature of at least a portion of the gas distribution system can be controlled to a temperature up to 150° C., or within the range 50° C. to 150° C. (preferably, 70° C. to 110° C.).

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen-containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma-containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, comprising:
   receiving a substrate within a process chamber, the substrate having exposed material layers including a titanium-containing material layer and at least one additional material layer;
   selectively etching the at least one additional material layer with respect to the titanium-containing material layer by exposing the substrate to a first controlled environment including a halogen-containing gas; and
   after the selectively etching, performing a non-selective etch in a second controlled environment, wherein in the non-selective etch both the at least one additional material layer and the titanium-containing material layer are etched, and
   wherein the selectively etching is performed at a lower temperature than at least part of the non-selective etch, and the at least one additional material layer includes a tungsten-containing layer.

2. The method of claim 1, wherein the selectively etching uses at least one of a gas-phase etch or a remote plasma etch.

3. The method of claim 1, wherein the titanium-containing material layer comprises titanium or titanium nitride.

4. The method of claim 1, further comprising controlling process parameters for the process chamber during the selectively etching to achieve target etch parameters.

5. The method of claim 1, further comprising controlling a temperature within the process chamber during the selectively etching to be in a temperature range from 35 degrees Celsius to 150 degrees Celsius.

6. The method of claim 1, wherein the halogen-containing gas comprises chlorine trifluoride, fluorine, or nitrogen trifluoride.

7. The method of claim 1, further comprising receiving the substrate in a second process chamber and forming the second controlled environment in the second process chamber.

8. The method of claim 1, further comprising forming the second controlled environment in the process chamber by modulating process parameters within the process chamber.

9. The method of claim 1, wherein the selective etching is performed by the halogen-containing gas reacting with the at least one additional material layer to remove the at least one additional material layer; and the non-selective etch is performed by sublimation.

10. The method of claim 9, wherein the sublimation is performed in a nitrogen environment at a higher temperature than the selective etching.

11. A method of etching, comprising:

receiving a substrate within a process chamber, the substrate having exposed material layers including a titanium-containing material layer and a tungsten-containing material layer;

selectively etching the tungsten-containing material layer with respect to the titanium-containing material layer by exposing the substrate to a controlled environment including a halogen-containing gas; and after selectively etching the tungsten-containing material layer, performing a sublimation to remove a portion of the titanium-containing material layer.

12. The method of claim 11, wherein the titanium-containing material layer comprises titanium or titanium nitride, and wherein the tungsten-containing layer comprises tungsten or tungsten oxide.

13. The method of claim 11, further comprising controlling a temperature within the process chamber during the selectively etching to be below 100 degrees Celsius, and wherein the halogen-containing gas comprises a fluorine-based gas.

14. The method of claim 11, wherein the performing the sublimation comprises increasing a temperature within the process chamber to be at a temperature above 100 degrees Celsius or in a temperature range from 80 degrees Celsius to 150 degrees Celsius.

15. The method of claim 11, wherein the sublimation of the titanium-containing material layer also etches a second material layer exposed on the substrate.

16. The method of claim 11, wherein the selectively etching is performed with at least one of a gas-phase etch or a remote plasma etch; and the sublimation is performed in a nitrogen environment at a temperature higher than the selectively etching.

17. The method of claim 16, wherein during the sublimation both the tungsten-containing material and the titanium-containing material are removed in a non-selective etch.

18. The method of claim 16, wherein during the selective etching a portion of the titanium-containing material layer is activated by gas adsorption to provide an activated portion, and the activated portion is removed during the sublimation.

19. A method of etching, comprising:

receiving a substrate within a process chamber, the substrate having exposed material layers including a titanium-containing material layer and at least one additional material layer;

selectively etching the at least one additional material layer with respect to the titanium-containing material layer by exposing the substrate to a first controlled environment including a halogen-containing gas;

after the selectively etching, performing a non-selective etch in a second controlled environment, wherein in the non-selective etch both the at least one additional material layer and the titanium-containing material layer are etched, wherein the selectively etching is performed in a non-plasma environment; and the non-selective etch is performed in an inert gas environment, and process gases adsorbed prior to the non-selective etch activate at least one of the titanium-containing material layer and the another material layer so that upon raising of temperature in the non-selective etch, portions of the titanium-containing material layer and the another material layer are removed by sublimation.

20. The method of claim 19, wherein the at least one additional material layer comprises at least one of tungsten, tungsten oxide, hafnium oxide, silicon oxide, silicon-germanium, silicon, silicon nitride, or aluminum oxide.

21. The method of claim 19, wherein the non-selective etch is performed at a higher temperature than the selectively etching.

* * * * *